United States Patent [19]
Patton et al.

[11] Patent Number: 4,965,755
[45] Date of Patent: Oct. 23, 1990

[54] METHOD AND APPARATUS FOR MONITORING AC INPUT SIGNALS

[75] Inventors: Paul B. Patton, Edgewood; Kenneth B. Kidder, Coon Rapids, both of Minn.

[73] Assignee: Honeywell Inc., Minneapolis, Minn.

[21] Appl. No.: 303,595

[22] Filed: Jan. 27, 1989

[51] Int. Cl.$^5$ .............................................. G06F 7/00
[52] U.S. Cl. ................................... 364/550; 364/178; 364/574
[58] Field of Search ............... 364/492, 487, 503, 550, 364/138, 574, 580, 481, 178, 179, 194, 486, 221.7, 569, 551.01; 377/2, 15, 37; 340/511, 640, 644, 577, 578, 579; 236/94; 237/8 R; 431/6, 12, 18, 24–27, 78; 307/350, 353; 328/151, 120; 324/77 A, 78 R, 78 E, 79 R; 371/6

[56] References Cited

U.S. PATENT DOCUMENTS

| | | | |
|---|---|---|---|
| 4,064,488 | 12/1977 | Chapman | 364/487 |
| 4,308,098 | 12/1981 | Neuner et al. | 364/574 |
| 4,519,025 | 5/1985 | Fayette | 364/178 |
| 4,519,540 | 5/1985 | Boulle et al. | 364/505 |
| 4,541,063 | 9/1985 | Doljack | 364/550 |
| 4,564,918 | 1/1986 | McNally et al. | 364/569 |
| 4,672,555 | 6/1987 | Hart et al. | 364/481 |
| 4,684,989 | 8/1987 | Roeder et al. | 364/574 |
| 4,694,402 | 9/1987 | McEachern et al. | 364/487 |
| 4,782,456 | 11/1988 | Poussier et al. | 364/574 |
| 4,829,457 | 5/1989 | Russo et al. | 364/550 |
| 4,843,580 | 6/1989 | Ridoux et al. | 364/569 |
| 4,852,046 | 7/1989 | Jones et al. | 364/184 |
| 4,908,775 | 3/1990 | Palusamy et al. | 364/551.01 |

*Primary Examiner*—Parshotam S. Lall
*Assistant Examiner*—Michael Zanelli
*Attorney, Agent, or Firm*—Kinney & Lange

[57] ABSTRACT

The present invention is a method and apparatus for monitoring a plurality of AC input signals to a control system. An AC interrupt signal is generated, based on an AC system signal which is substantially phase-synchronous with the AC input signals, for an interrupt time period corresponding to a time period when the AC system signal exceeds a predetermined threshold voltage. The AC interrupt signal is verified and a timer is set for a pseudo-random time value. The AC input signals are sampled when the timer has reached the pseudo-random time value to determine the presence or absence of valid AC input signals.

15 Claims, 14 Drawing Sheets

Digital Signal Conditioning

Digital Signal Conditioning 4,965,755

METHOD AND APPARATUS FOR MONITORING AC INPUT SIGNALS

BACKGROUND OF THE INVENTION

1. Field of the Invention

This invention relates to a method and apparatus for monitoring AC signals. More particularly, this invention relates to a method and apparatus for monitoring AC input signals to a control system.

2. Description of the Prior Art

There are many applications for industrial and commercial heating systems such as boilers and burners. These boilers and burners are generally controlled by some type of control system which must meet various safety standards. The control system must also be cost effective and easy to use. The boiler/burner control systems generally monitor various inputs and, based on those inputs, command the boiler to be in a desired state (e.g., ignition, stand-by, off). The inputs often are in the form of AC input signals which indicate whether relay contacts, sensor switches, safety interlocks or the like are open or closed based upon the presence or absence of an AC signal.

The input signals to computerized boiler/burner control systems typically include digital input signals derived from the AC input signals, and must be very reliable in order for the control system to operate the boiler or burner in a safe manner. A main priority for the boiler/burner control system is to react to real events that occur in the boiler or burner, in the various valves which control the boiler or burner, and other control circuitry. Although reaction to real events is desired, it is also desirable for the boiler control system to tolerate noise which will normally be present in the control system environment.

There are several types of noise which are commonly present in burner environments. Real-world line noise may occur as an isolated event lasting only a few microseconds, or it may tend to occur in bursts that are a few milliseconds to several line cycles long. Noise bursts are caused by various sources including a large motor turning on and off, a heavy contactor being opened or closed, or ignition noise from the ignition contactor being opened or closed, or ignition noise from the ignition mechanism on the burner. Additionally, if the noise is caused by a device that is in some way synchronized to the AC power line frequency then a noise burst lasting up to several milliseconds may be both synchronized and repetitive, appearing at the same time with respect to the beginning of each line cycle. Examples of devices which may produce synchronous, repetitive noise include emergency power generators, power or speed controls which use triac switching devices to deliver only part of each line cycle to the load, and large synchronous motors. Finally, a short-duration line dropout may be considered as a form of noise, in that input signals will be invalid until the line voltage returns.

Reading valid input data samples during a noise burst will either be difficult, since only an occasional sample will be unaffected, or impossible, since all samples may be corrupted during the noise burst. Furthermore, if the noise burst is synchronous and repetitive and it also coincides with the time of reading the input data samples, then all data samples may be more or less corrupted and the occurrence of invalid data samples will be chronic and persistent.

It is desirable for the control system to tolerate a certain amount of noise to remain cost effective. In other words, if the burner control system were to shut down the burner each time it detected an invalid input data sample, many nuisance shut-downs would occur as a result of normal, expected line noise. The time and effort required for an operator to detect the shut-down and the reason for the shut-down, and to restart the burner or boiler is very costly. Although it is desirable to tolerate a certain amount of noise, there must be enough valid input data samples available to the control system to allow it to control the burner safely. Therefore, excessive noise must not be tolerated by the burner control system.

For these reasons, there is a need for a burner control system which tolerates normal line noise yet which, even in the presence of noise, ensures that the quality of the data input samples is high enough to be generally trustworthy and that the noise is not excessive.

SUMMARY OF THE INVENTION

The present invention is a method and apparatus for monitoring a plurality of AC input signals to a control system. An AC interrupt signal is generated, based on an AC system signal which is substantially phase-synchronous with the AC input signals, for an interrupt time period corresponding to a time period when the system signal exceeds a predetermined threshold voltage. The AC interrupt signal is verified and a timer is set for a pseudo-random time value. The AC input signals are sampled when the timer has reached the pseudo-random time value to determine the presence or absence of valid AC input signals.

DETAILED DESCRIPTION OF THE PREFERRED EMBODIMENTS

Overview

Figure 1:
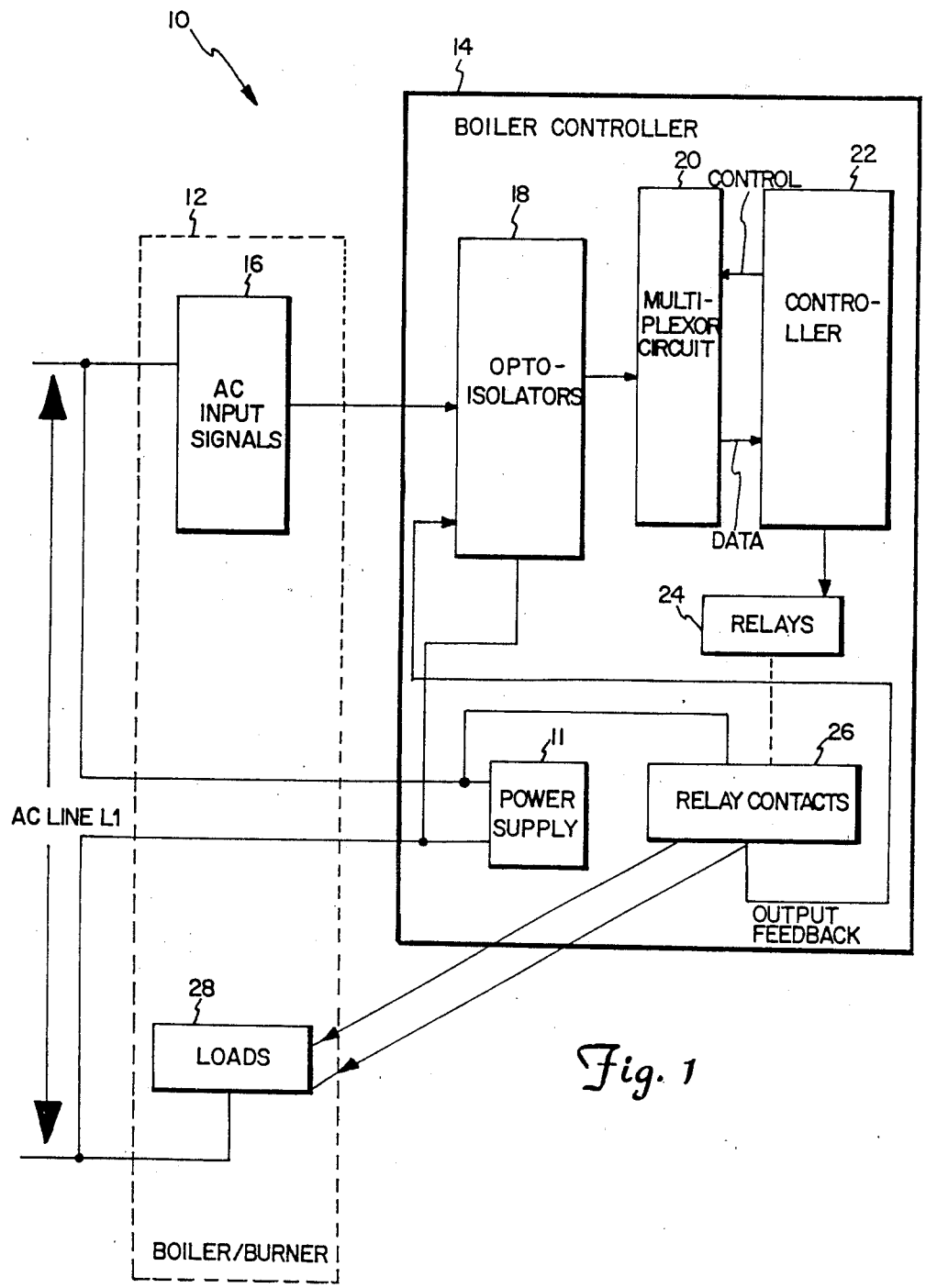
FIG. 1 is a block diagram of the control system of the present invention.

FIG. 1 shows a block diagram of control system 10 of the present invention. Control system 10 comprises boiler/burner 12 and boiler controller 14. AC line voltage L1 is applied to boiler/burner 12 power supply 11, opto-isolators 18 and relay contacts 26. Various parameters are sensed at boiler/burner 12 and the state of the sensed parameters is provided to boiler controller 14 in the form of AC input signals 16. AC input signals 16 are substantially phase-synchronous with AC line voltage L1.

AC input signals 16 are conditioned and converted into logic signals by opto-isolators 18 in boiler controller 14. The logic signals, conditioned and converted in opto-isolators 18, are provided, in this preferred embodiment via multiplexor circuit 20, to controller 22 (which preferrably includes a micro-computer) in boiler controller 14.

Controller 22 further conditions the logic signals provided from opto-isolators 18 and processes that information. Based on the processed information, controller 22 generates control outputs which are provided to relays 24 which, in turn, control relay contacts 26. When relays 24 command closure of relay contacts 26, AC line voltage L1 is applied to loads 28 in boiler/burner 12. In this way, boiler controller 14 controls boiler/burner 12. Additionally, several outputs from relay contacts 26 are fed back to opto-isolators 18. This allows closed-loop control of boiler/burner 12.

The Hardware

Figure 2:
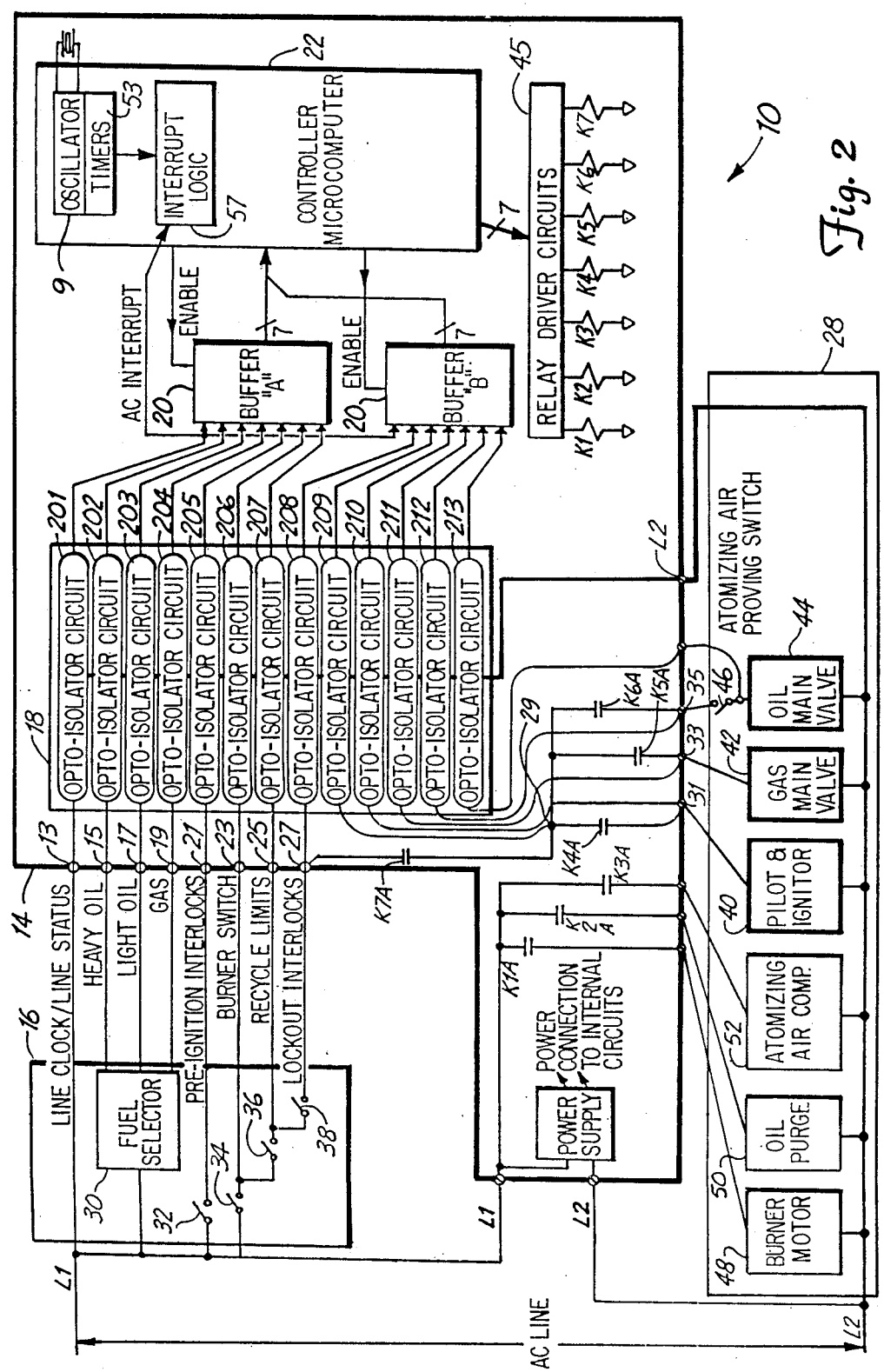
FIG. 2 is a more detailed block diagram of the control system of the present invention.

FIG. 2 shows a more detailed diagram of heating system 10. AC input signals 16 typically comprise a line status or line clock signal at line clock input 13, and fuel select signals at fuel select inputs 15, 17, and 19, from fuel selector 30, which indicate to boiler controller 14 which fuel is to be used in heating system 10 (e.g., heavy oil, light oil or gas). AC input signals 16 also typically comprise inputs from several switches indicating the state of various sensed parameters at boiler/burner 12. These include a pre-ignition interlock signal at a pre-ignition interlock input 21, which is a safety interlock that causes a safety shutdown when main fuel valves are not properly closed. The pre-ignition interlock signal, in this preferred embodiment, is provided by closure of switch 32.

Another of AC input signals 16 is typically a burner switch signal provided to controller 14 at burner switch input 23. The burner switch signal is merely a toggle switch that is used at times to turn on and off heating system 10. This is provided in, this preferred embodiment, through switch 34.

A recycle limit signal is also provided to boiler controller 14 at recycle limit input 25. This signal represents the state of various parameters whose function is to deenergize any fuel valves or ignitors in heating system 10 but whose function is not important enough to require a safety shutdown. If switch 36 opens and the recycle limits signal disappears, then the burner in boiler/burner 12 will simply recycle.

A lockout interlock signal is provided to controller 14 at lockout input 27. The lockout interlock signal is dependent upon several safety interlocks and provides AC power to several loads 28 (particularly pilot and ignitor 40, gas main valve 42 and oil main valve 44) through safety relay contact K7A and switch 38. When this signal disappears, loads 40, 42, and 44 are automatically deenergized and human intervention is required to reset heating system 10.

Switches 32, 34, 36, and 38 are represented for simplicity's sake, as a single switch. More typically, however, they may comprise several series connected switches each of which is controlled by a different sensed parameter.

All of the AC input signals just described are provided to opto-isolators 18 (opto-isolator circuits 201-208, respectively) where they are converted to logic signals which change states as the AC input signals go between their positive and negative alternations. These logic signals from opto-isolators 18 are supplied to controller 22 through multiplexor circuit 20. Multiplexor circuit 20, in this preferred embodiment, comprises tri-state buffers A and B which, when selected by controller 22, connect their inputs to their outputs and, when deselected, provide their outputs in a high impedance state.

Similarly, the signals appearing at safety relay node 29 and load contact nodes 31, 33, and 35, as well as the signal appearing at the output of atomizing air proving switch (AAPS) 46 (which is energized when atomizing air is present and oil is the selected fuel) are provided to opto-isolators 20 (particularly opto-isolator circuits 209-213, respectively). These signals are also converted to logic signals which change states as the AC input signals go between their positive and negative alternations.

Therefore, buffers A and B provide information which represents the state of various control input signals to controller 22. Based on these inputs, controller 22 commands various outputs to boiler/burner 12 by commanding relay driver circuits 47 to energize or deenergize relay coils K1-K7. For example, if controller 22 determines that pilot and ignitor 40 should be energized, controller 22 will command relay drive circuits, 47 to energize relay coil K4 which will close relay contacts at relay K4A and apply AC power to pilot and ignitor 40. Similarly if controller 22 determines that burner motor 48, oil purge valve 50 or atomizing air compresser 52 should be shutdown it will provide outputs to relay driver circuits 47 commanding it to deenergize relay coils K1, K2 or K3, respectively, thereby disconnecting AC line voltage L1 from the corresponding loads.

Opto-isolator Circuit

Figure 3:
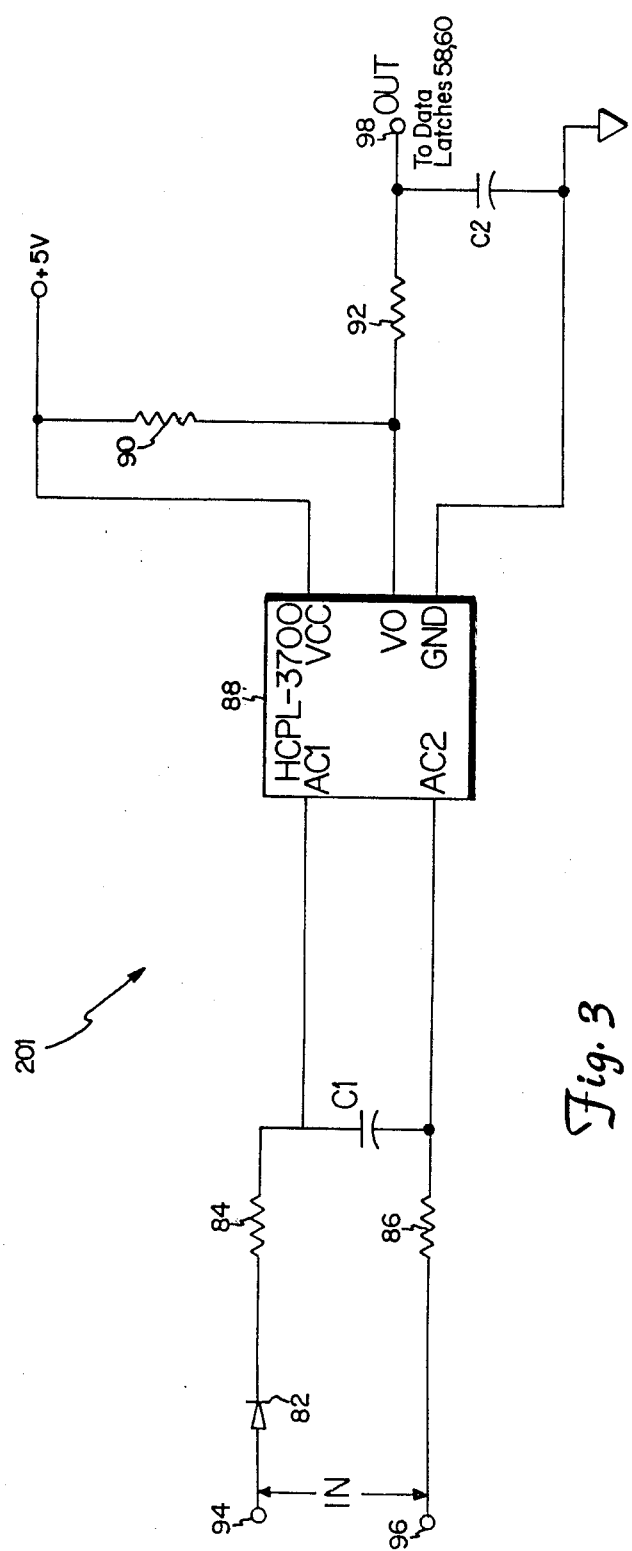
FIG. 3 is a schematic diagram of the opto-isolator circuit of the present invention.

FIG. 3 shows a schematic drawing of a typical opto-isolator circuit used with the present invention. It is desirable to isolate the low voltage signals which are processed by controller 22, and which are used throughout burner control system 10, from both the normal AC line voltage and also from any high voltage spikes which may be present on the AC line voltage. The opto-isolator circuit in FIG. 3 (for example opto-isolator 201) is comprised of diode 82, resistors 84 and 86, capacitor C1, opto-isolator chip 88, resistors 90 and 92, and capacitor C2. Resistors 84 and 86 and capacitor C1 form a filter on the input side of opto-isolator chip 88. Resistors 90 and 92 and capactor C2 form a filter on the output side of opto-isolator chip 88. Both of these filters are designed as low pass filters to remove high speed noise transients.

If an AC input signal (in this case AC line voltage L1) is present across input terminals 94 and 96, diode 82 half-wave rectifies the AC input signal and only applies a signal to opto-isolator chip 88 during the positive alternation of the AC input signal since, during negative alternation, diode 82 is blocking. During the positive alternation of the AC input signal, opto-isolator chip 88 effectively connects output pin VO to GND. This causes a signal at output terminal 98 to go "low" (i.e., to a digital "0"). Since this is an inverting circuit the output will be considered to be "on" when its voltage is approximately zero, and "off" when it is approximately equal to VCC voltage (in this preferred embodiment, VCC is +5V).

Since the AC input signal will only be applied to opto-isolator chip 88 during the positive alternation, in order for controller 22 to "see" the signal, it must enable multiplexor circuit 20 during the positive alternation of the AC input signals and read the signals provided through buffers A and B. The AC input signals are phase-synchronous with the AC line voltage. Therefore, in order to detect whether the AC input signals are present, controller 22 must read the logic signals during the positive alternation of the AC line voltage. For this reason, each time the line clock signal goes high (i.e., each positive alternation of the AC line voltage), an AC interrupt is generated to controller 22. This alerts controller 22 to the fact that it must soon read buffers A and B in order to see the information generated from opto-isolators 18.

To account for different delays through opto-isolator circuits 201–213, capacitor C1 in opto-isolator circuit 201 is larger than capacitors C1 in the other opto-isolator circuits 202–213. Therefore, the AC input signals, which are applied to opto-isolator circuits 202–213 and which are substantially phase-synchronous with the AC line voltage, have a set-up time with respect to the AC line voltage, the line clock and the AC interrupt. This set-up time helps to assure that the AC input signals are read only during the "fat" part of the signal so any noise must be significant in order to affect the signal and also helps to assure that they are valid when controller 22 enables multiplexor circuit 20.

Opto-isolator chip 88 also operates with hysteresis. This ensures that any input signal which causes the signal on output pin VO to change state must change significantly before the signal at pin VO will change to the opposite state. This hysteresis helps prevent output jitter.

Also, since diode 82 is blocking during the negative alternation, opto-isolator circuit 21 may be tested. To test the circuit controller 22 enables multiplexor circuit 20 during the negative alternation of the AC line voltage and reads the logic signals. If any of the logic signals from opto-isolators 18 are on, then controller 22 knows that something in the opto-isolator circuit is faulty since diode 82 should be blocking and the signal at output terminal 98 should be "off" during the negative alternation of the AC input signal. The control system is generally set up so that any critical conditions will be signalled to controller 22 by an "off" signal from an opto-isolator. This test assures that the opto-isolator is capable of providing an "off" output and is not short-circuited or otherwise stuck in the "on" state.

In sum, the logic signals generated by opto-isolator circuits 201–213 are signals which change state (between digital 1's and 0's) when a corresponding AC input signal is present and they do not change state and remain at 0 when the corresponding AC input signal is absent.

Figure 4:
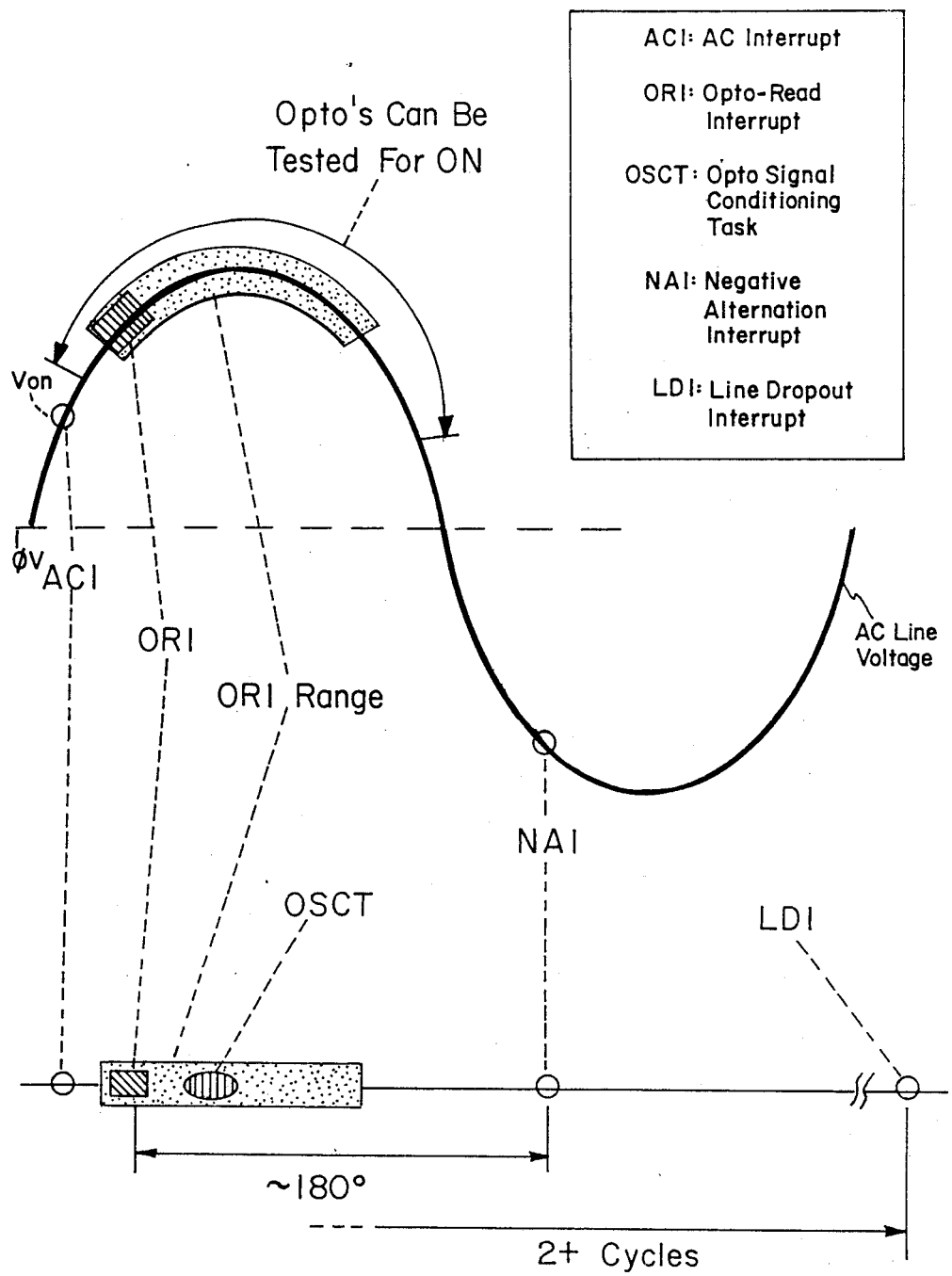
FIG. 4 is a drawing of a portion of a waveform representing an AC input signal to the burner control system of FIG. 1, which illustrates timing of the digital signal processing of AC input signals.

FIG. 4 is a drawing of one full cycle of the AC line voltage. FIG. 4 shows the point at which various routines are executed by controller 22 with respect to the AC line voltage cycle. When the AC line voltage as applied to the input of an opto-isolator circuit reaches voltage Von, diode 82 begins to conduct. At that point, output terminal 98 of opto-isolator 201, after a short propogation delay, goes "on." This generates the AC interrupt (ACI) to controller 22. FIG. 4 will be referred to periodically throughout the following discussion.

ACI Routine

Figure 5:
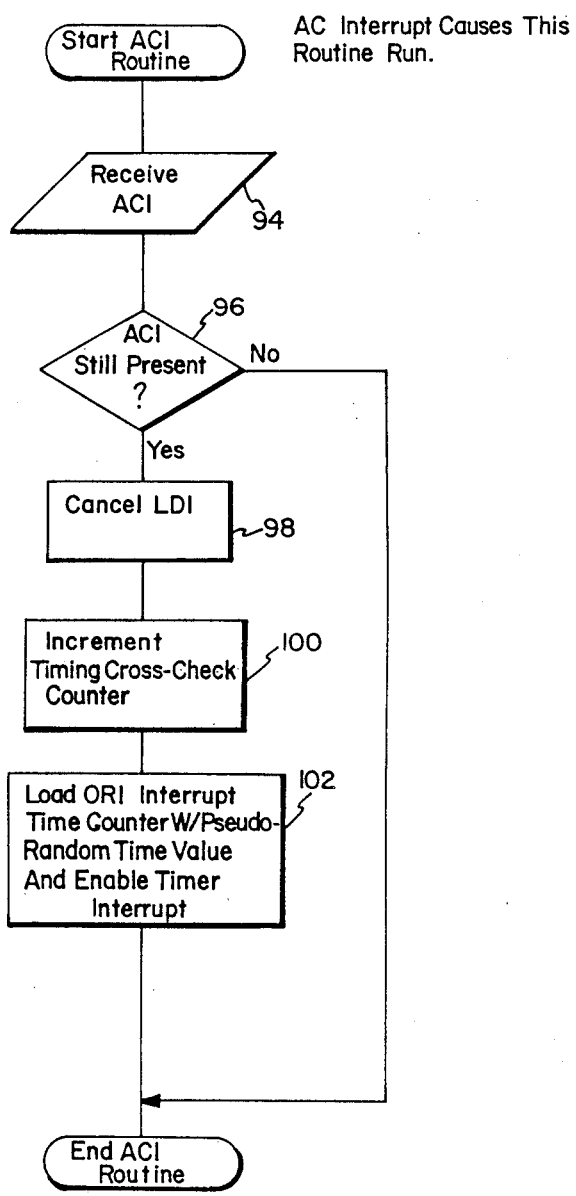
FIG. 5 is a flow chart of the AC Interrupt (ACI) routine.

When the AC interrupt is supplied to controller 22, controller 22 begins to execute an ACI routine. FIG. 5 is a flow chart showing the steps in the ACI routine. Controller 22 receives the AC interrupt on an interrupt pin which provides the AC interrupt to its interrupt logic 51 as indicated by block 94. Upon receiving the AC interrupt, controller 22 re-reads its interrupt pin to determine whether the ACI interrupt voltage level is still present as shown by block 96. This is done to eliminate any erroneous AC interrupts caused by a short noise spike on the interrupt pin to controller 22.

If the AC interrupt voltage level is not present when controller 22 re-reads the interrupt pin, controller 22 determines that the initial interrupt was merely a noise spike and jumps back to the state it was in at the beginning of the ACI routine simply ignoring the initial AC interrupt. However, if controller 22 determines the that the AC interrupt voltage level is still present after re-reading the AC interrupt pin, controller 22 cancels a line dropout interrupt (LDI) routine (which will be described more fully later) as indicated by block 98.

After cancelling the LDI routine, the controller increments a timing cross check counter, as indicated in block 100. The timing cross check counter is used to verify the timing of controller 22. This process will also be described later.

Once the timing cross check counter has been incremented, controller 22 loads an opto-read interrupt (ORI) counter (one of timers 53) with a pseudo-random time value, as indicated in block 102. All the AC input signals are read during the opto-read interrupt (ORI) routine which commences when the opto-read interrupt counter counts down from its pseudo-random value to zero. This effectively adds a pseudo-random value to the time delay between the AC interrupt and the opto-read interrupt. The relationship between the ACI routine and the ORI routine with respect to the AC line voltage can be seen in FIG. 4.

The pseudo-random time value assures that the ORI routine will occur at significantly different phase angles during any two adjacent line cycles. Hence, over a wide range of AC line cycles, the ORI routine will be distributed randomly throughout the range of possible timings in an ORI range.

The pseudo-random time value is limited to be within the time during which opto-isolators 18 will be in the "on" condition representing the presence of an AC input signal. This is shown as the shaded area in FIG. 4. This random time value is set in order to make control system 10 less sensitive to synchronous noise which is caused, for example, by a spinning motor and which occurs at the same time during each line cycle. Since the ORI routine occurs at significantly different time intervals within the ORI range, the AC input signals are read at significantly different time intervals within the ORI range and it is likely that synchronous noise will be avoided most of the time.

ORI Routine

When the ORI timer reaches zero, it generates an interrupt which causes the ORI routine to begin.

Figure 6:
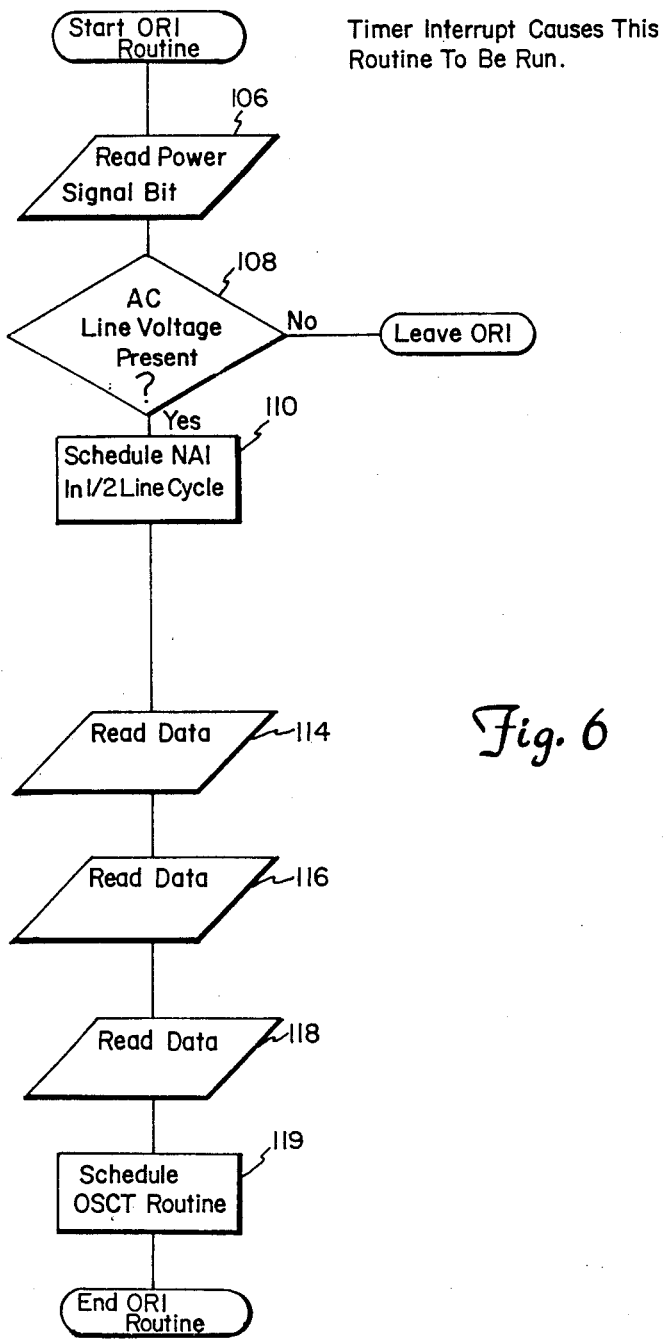
FIG. 6 is a flow chart of the Opto Read Interrupt (ORI) routine.

FIG. 6 shows a flow diagram of the ORI routine. Block 106 indicates that controller 22 first reads a power signal bit which is the data bit that corresponds to the output of opto-isolator 201 by enabling one of the buffers in multiplexor 20. This power signal bit signifies whether the AC line voltage is present. If the AC line voltage is not present, controller 22 jumps out of the ORI routine, ignoring it as if it never happened and returns to a state where it is executing other programs or waiting for an interrupt. This is indicated in block 108. If the AC line voltage is present, however, controller 22 schedules a negative alternation interrupt (NAI) routine to be run in approximately one-half line cycle (i.e., 180°). This is indicated in block 110. The relationship between the NAI routine and the ORI routine is shown in FIG. 4 and will be described in more detail later.

Next, controller 22 reads the logic signals provided by opto-isolators 18 via multiplexors 20. This is shown in blocks 114, 116, and 118.

The AC line voltage is applied to opto-isolator 201. The logic signal generated by opto-isolator 201 (the power signal bit) is applied to each buffer in multiplexor 20. During an opto-read, controller 22 reads all of the data bits provided via buffer A, then all of the bits provided via buffer B. These bits represent the AC input signals, including the power signal bits which are applied to buffers A and B from opto-isolator 201. The process of reading data bits from buffers A and B is repeated three times, as indicated in blocks 114, and 118. Each time controller 22 reads the data bits, it stores them in memory.

Once controller 22 has read the bits from buffers A and B three times and stored the values it read for those data bits, it has a group of three samples for each data bit. In other words, it has read and stored the value of each data bit from buffer A three separate times. It has done the same for the data bits from buffer B.

Since buffers A and B were read three times in an interleaved fashion, the data bits were not read three times sequentially and the samples obtained for each data bit are distributed in time. This tends to avoid false signals which would be caused by synchronous or other noise transients on the data lines.

OSCT Routine

Figure 7A:
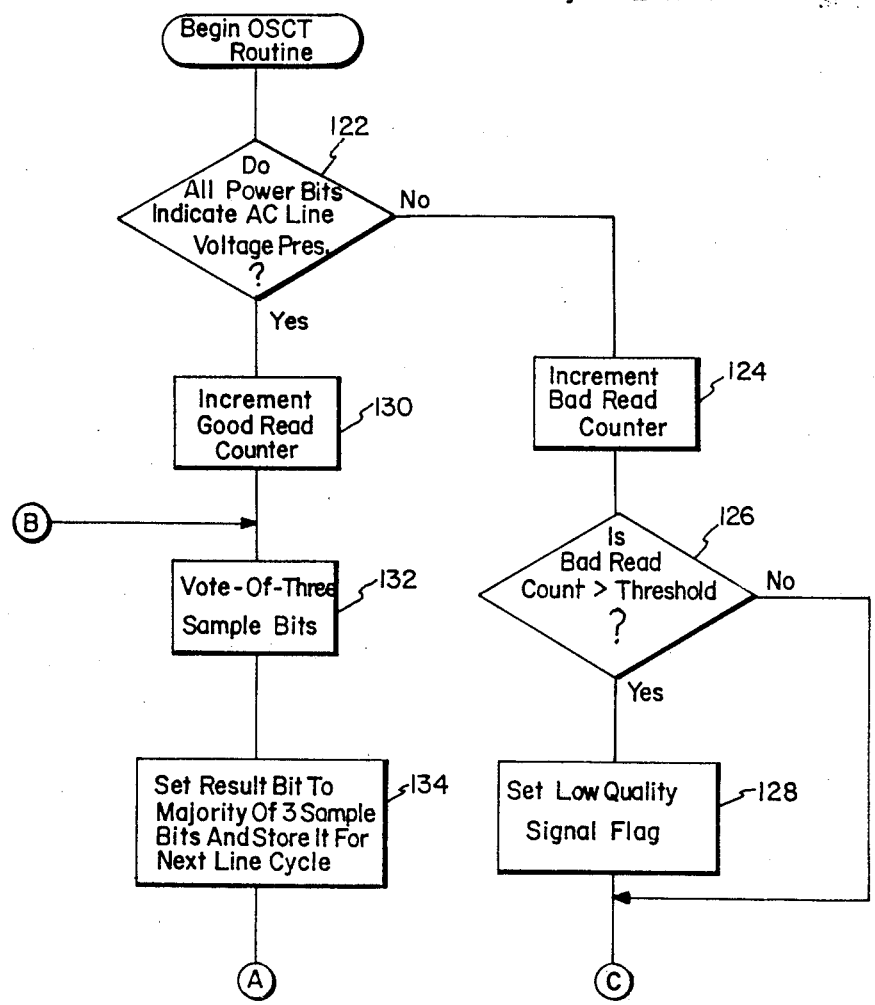
FIGS. 7A-7C are a flow chart of the Opto-Input Signal Conditioning Task (OSCT) routine.
Figure 7B:
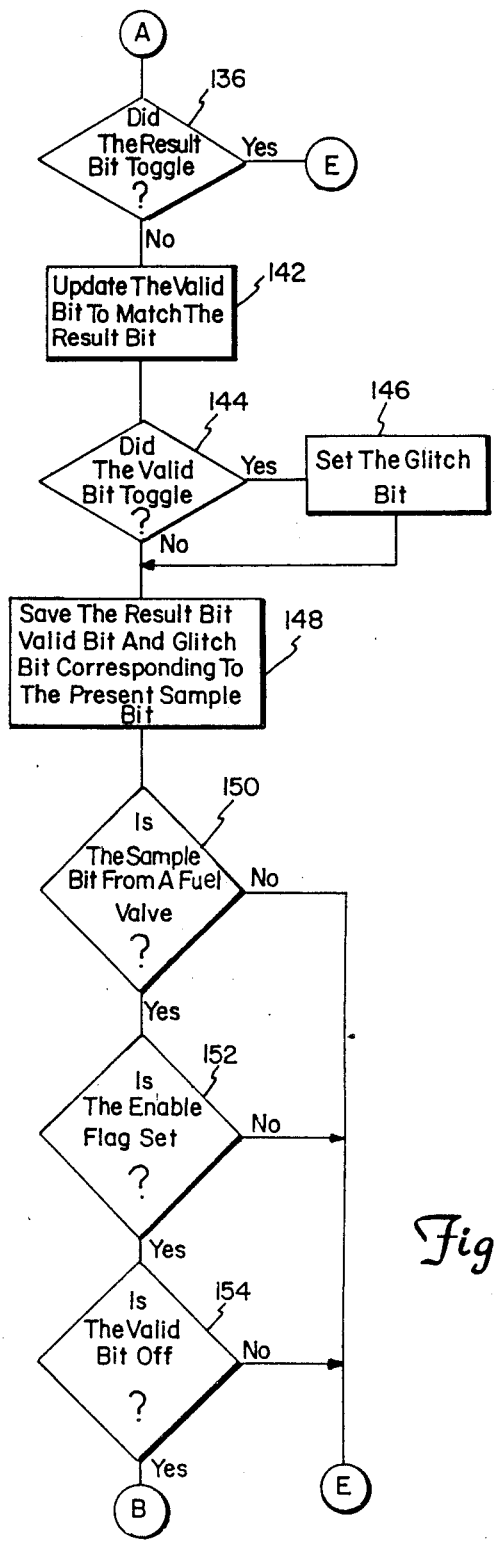
Figure 7C:
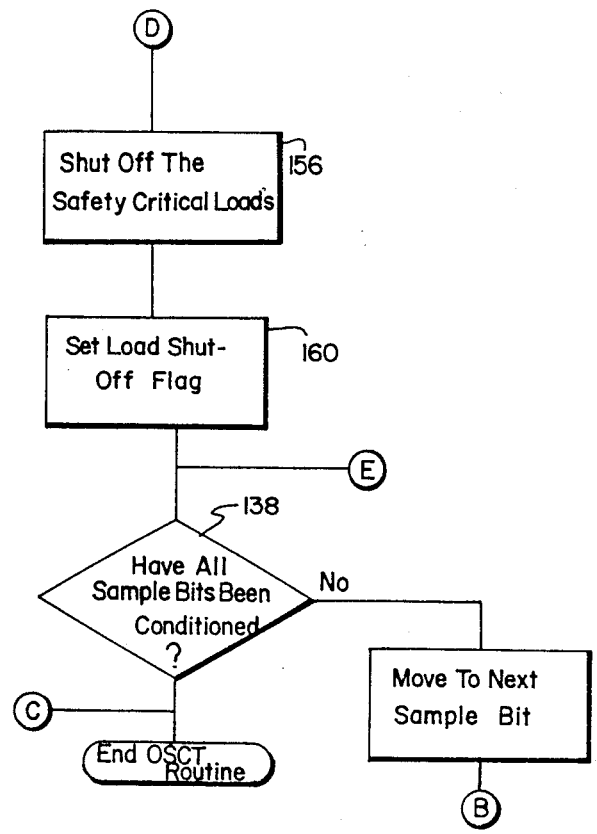

When all the data bits have been read, the ORI routine schedules the opto-input signal conditioning task (OSCT) routine to run as shown by block 119. This is shown in FIG. 4. A flow diagram for the OSCT routine is shown in FIGS. 7A, 7B and 7C. The OSCT routine may run immediately (and could be a part of the ORI) or it may be deferred (if the computer is being managed by a multi-tasking operating system). In any case, the time-critical part, reading opto-isolators 18 during the "fat" part of AC cycle, has been completed by the ORI routine. The only time constraint on the OSCT routine is that it must run before the next ORI occurs, in one line cycle.

The first task of the OSCT routine is to examine the three samples of the power signal bits which were read from buffer A and the three samples of the power signal bits which were read from buffer B and stored in controller 22 during the ORI routine. Controller 22 determines whether all six of the sample power signal bits indicate that the AC line voltage was present. This is shown in block 122. If any of the six power signal bits indicate that AC line voltage was not present, a bad read counter is incremented as indicated in block 124.

Controller 22 then determines whether the count in the bad read counter is greater than a predetermined threshold level. This is shown in block 126. If the bad read count is not greater than the threshold level, controller 22 jumps out of the OSCT routine and all of the data bits which were read in the ORI routine are merely ignored as untrustworthy. The controller then continues to run other routines or is in a state where it is waiting to receive the next interrupt signal. If, on the other hand, the bad read counter is greater than the threshold level, then controller 22 sets a low quality signal flag (block 128) which is used in a signal quality test that will be described in greater detail later and, again, continues to run other routines or is in a state where it is waiting for the next interrupt signal.

However, if all the samples read from the power signal bits indicate that the AC line voltage was present, a good read counter is incremented. This is indicated in block 130. Once the good read counter is incremented, controller 22 begins to process the first data bit which it read from buffer A other than the power signal bit. To do this, controller 22 retrieves the three sample bits which were stored and which correspond to the first data bit. Controller 22 performs a vote-of-three function. In performing this function, controller 22 determines whether a majority of the three sample bits, which were read for the first data bit, is "1" or "0". If a majority of the three sample bits is "1", controller 22 sets a result bit R1 to "1". If the majority of the three sample bits is "0", controller 22 sets the result bit R1 to "0". In any case, result bit R1 is stored for the next line cycle. This is indicated in block 134.

Once result bit R1 is set to the proper value, controller 22 determines whether the result bit R1 has toggled since the last line cycle. In other words, controller 22 compares the present result bit to the result bit which was obtained during the previous occurrence of the OSCT routine. This function is indicated in block 136. If they are not the same, controller 22 determines that the result bit R1 toggled and controller 22 stops conditioning the present data bit and determines whether there are any more data bit samples to be processed. This is done in block 138. If any of the sample bits have not been conditioned, controller 22 moves to the next data bit and begins to condition it by performing the vote-of-three function at block 132 and by setting a corresponding result bit R1.

If, on the other hand, all of the sample bits have been conditioned, controller 22 jumps out of the OSCT routine as shown by block 138.

If result bit R1 has not toggled, as determined in block 136, controller 22 updates a valid bit to match the value of result bit R1. This is indicated in block 142. As it updates the valid bit, controller 22 determines whether the update will cause the valid bit to toggle. If it toggles, a glitch bit is set in block 146 and controller 22 moves on; if it does not toggle, no glitch bit is set. In either case, for each input which is monitored through buffers A and B, the result bit, the valid bit and the glitch bit which correspond to the present set of three sample bits are stored (block 148).

The result of this processing, in blocks 132, 134, 136, 142, 144, 146 and 148 is that the valid bit is updated to match result bit R1 only if two vote-of-three results (from two separate, successive executions of the OSCT) agree on the state of bit R1; and, if this agreed-upon state causes the valid bit to toggle then the corresponding glitch bit is set.

Special Handling of Fuel Valve Bits and Line Dropout

In burner control system 10, if AC power to the fuel valves (either the gas main valve 42 or the oil main valve 44) is momentarily lost, the control system must ensure that the valves do not bounce open again. If they do, this can cause a "puff-back" which is usually a minor explosion but which can be hazardous. This momentary power loss to fuel main valves 42 and 44 could be caused by a temporary dropout of the AC power line or a momentary interruption from noisy switch contacts, for example. Therefore, it may be desirable to shut down fuel valves 42 and 44, and pilot/ignitor 40, (the safety critical loads) whenever a fuel valve which is supposed to be "on" is read by controller 22 as being "off" and to do this immediately, when the condition is first detected by the signal conditioning routine, instead of waiting for another routine (the sequence logic for instance) to act on the signals at some later time. This is taken care of in blocks 150, 152, 154, 156 and 160 of FIGS. 7B and 7C.

First, in decision block 150, controller 22 determines whether the current data bit which is being conditioned is from a fuel valve. In other words, is the current data bit that is being conditioned from opto-isolator circuits 211 or 212 corresponding to the feedback signals from gas main valve 42 or oil main valve 44 in FIG. 2. If it is not, controller 22 jumps to decision block 138 to determine, as discussed earlier, whether any sample bits are left to be conditioned and continues on from there.

At times the conditions may not be present when it would be necessary to shut down the safety critical loads if a main fuel valve is momentarily deenergized. For those reasons, this routine will only be performed when an enable flag is set. Therefore, if the sample bit is from a fuel valve, controller 22 then determines whether the enable flag is set as indicated in block 152. If the enable flag is not set, this routine need not be run and controller 22 again jumps to decision block 138 to see if any more sample bits need to be conditioned.

If the enable flag is set, controller 22 must determine whether the bit indicates that the fuel valve is "off." To do this, as shown in block 154, controller 22 examines the valid bit to see if it is off. If it is not off, the fuel main valve has not lost power and controller 22 again jumps to block 138. However, if the valid bit is off, indicating that the fuel main valve is deenergized, controller 22 shuts down the safety critical loads as indicated in block 156. The controller then sets a load shutoff flag in block 160 to alert any further processing routines such as the sequence logic as to what has happened.

Sequence Logic

Once all the sample bits have been conditioned and stored, the controller determines whether it is time to run a sequence logic routine. The sequence logic routine occurs approximately once every 0.5 seconds and is the routine which examines all the AC input signals and analog sensor input signals (not shown), and determines which control output signals should be commanded by controller 22.

If 0.5 seconds have elapsed since the last time the sequence logic was run, controller 22 has three bits to process which are associated with each AC input signal. Two of these bits have already been defined. They are the valid bit, which is the input signal's most recent valid state; and the glitch bit which is set if the valid bit has changed state. A third bit is used by the sequence logic which is called a glitch-mask bit.

When the sequence logic in controller 22 commands a new output state through the control outputs, it determines which AC input signals will change as a result of the new output state and it sets the glitch-mask bits which correspond to the changing AC input signals. Then, 0.5 seconds later, when the sequence logic runs again, it forgives any glitch (state change) from any AC input signal whose state was supposed to change as the result of the new output state commanded by controller 22. In other words, the sequence logic forgives any glitches in AC output signals that have their corresponding glitch-mask bits set. The sequence logic clears both the glitch bit and the glitch-mask bit before any further signal processing is done. The glitch-mask bit in effect, hides the glitches from subsequent logic tests.

Figure 7D:
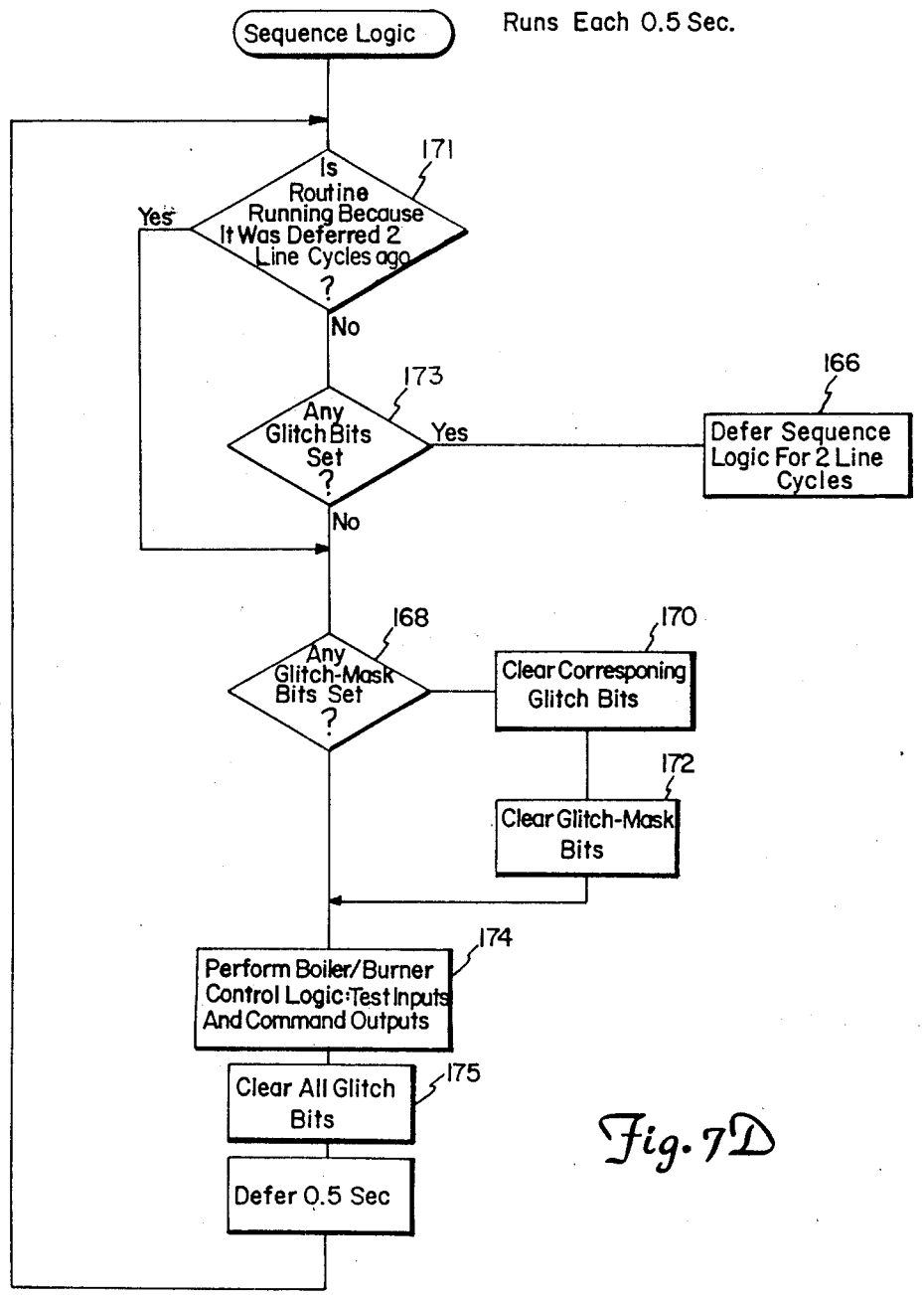
FIG. 7D is a flow chart of the sequence logic routine.

It should be noted that the sequence logic only commands a new output state very rarely (on the order of tens of seconds). Also, glitches are masked on a case-by-case basis for only a single 0.5 second interval; therefore, actual glitches will not be missed by controller 22. The glitch-mask process is seen in blocks 168, 170, and 172 of FIG. 7D.

After the glitch-mask processing is completed, the sequence logic routine performs the control logic that relates to the control of the boiler/burner system by testing the valid and glitch bits for each AC input signal and using this information and other information (analog sensor readings, for example) to determine the correct output signals from controller 22 to relay drives 24. This is shown by block 174. When the control logic has finished, the glitch bits are all cleared, as shown by block 175, to prepare to detect any glitches that may occur during the 0.5 second interval that will elapse before the sequence logic runs again.

Race Prevention

In control system 10, a condition can occur where, for example, one switch may open causing the AC input signal to two opto-isolators to disappear. This occurs because in control system 10 several AC input signals are "downstream" of other AC input signals. Since the circuitry in opto-isolators 18 is made from standard non-matched components, even though a single condition can cause two opto-isolators to be energized or de-energized simultaneously, the propogation time through the opto-isolators is not exactly the same. Therefore, if, for example, a condition occurred which caused the AC input signal at opto-isolator 203 and the AC input signal at opto-isolator 205 to disappear at the same time, the digital output of opto-isolator 203 may go "off" before the digital output of opto-isolator 205 (or vice versa) due to the difference in propogation times through opto-isolators 203 and 205. If controller 22 were to read data provided via buffers A and B after the digital output of opto-isolator 203 went "low" but before the digital output of opto-isolator 205 went "low," controller 22 would be making decisions on incomplete information. This is called a "race problem" or a "race condition."

In control system 10, a race condition is already limited to a certain extent. In order to be a problem, the AC input signal status change must occur during a small window of time. This is because the signal with the shortest propogation time must arrive shortly before controller 22 reads buffers A and B, and the signal going through the longest propogation delay must arrive shortly thereafter.

Not only is the window during which the status change must occur very small, to cause a problem it must be positioned roughly two line cycles prior to the running of the sequence logic which is run every 0.5 seconds. This is because if the status change occurs any earlier than two line cycles before the sequence logic is run, the OSCT routine will have fully processed all of the racing inputs into a final valid state (i.e., all the racing inputs would have "crossed the finish line"). Also, if the race occurs later than two cycles prior to the running of the sequence logic, the race would not be a part of the information seen by the sequence logic until the next occurrence of the sequence logic, approximately 0.5 seconds later. By that time, all the racing signals will certainly have finished.

Even though this race condition is very unlikely, it still can occur and can cause problems. It should be noted that where the race condition occurs, it always manifests itself as a nuisance shut-down and not as a safety hazard. However, nuisance shut-downs are undesirable and the race condition should be prevented if possible. Therefore, control system 10 employs another technique to further reduce the chances of a race condition.

At the time when the sequence logic is normally scheduled to be run by controller 22 (i.e., 0.5 second intervals) just prior to running the sequence logic, controller 22 scans all the glitch bits to see if any of them are set. If they are, that indicates that a status change has occurred in one of the AC input signals. Since a status change has occurred, in order for a race condition to be present, controller 22 would have to run the sequence logic before the signal going through the longest propagation delay arrives (i.e., within two line cycles). For this reason, if controller 22 detects that any glitch bits are set, it defers running the sequence logic for two line cycles. After two line cycles, the sequence logic is run and a second deferral does not happen. This race prevention technique is shown in blocks 162, 164, and 166 of FIG. 7D.

Signal Quality Testing

Control system 10 employs two techniques for testing quality of the AC input signals which are read by controller 22. The first technique is a low quality signal test. During the running of the sequence logic, there are a number of particularly critical decisions which must be made. These are the decisions which lead controller 22 to command an output state which must occur in order for safety to be maintained. It is desirable that a critical decision is not made on the basis of old information. Controller 22 would be making this decision based on old information if the information obtained during the previous 0.5 seconds were substantially affected by noise and subsequently thrown out; that is, ignored due to processing in decision blocks 108, 122, or 136. In that case, controller 22 would be basing its critical decisions on information obtained over 0.5 seconds prior to the decision (i.e., old information).

For this reason, the bad read counter is used in the OSCT routine described in conjunction with FIGS. 7A-7C. The first task of the OSCT routine is to determine whether all of the power signal bits indicate that the AC line voltage is present. If any of them indicate that the AC line voltage is absent, the bad read counter is incremented as seen in block 124. If the count in the bad read counter is greater than a predetermined threshold, a low quality signal flag is set. Therefore, controller 22 examines the state of the low quality flag in determining whether to make a critical decision. If the low quality flag is set, controller 22 knows that most of the information on which it is basing its decisions is old information since most of the current information was thrown out due to noise. Hence, controller 22 can defer making a critical decision until the next time the sequence logic is run, approximately 0.5 seconds later when the signal quality is better.

The second technique used by control system 10 to test the quality of the AC input signals is performed by an input signal quality test (ISQT) routine. The noise which tends to occur in the environment in which a control system such as control system 10 is located tends to occur in bursts that are a few milliseconds to several line cycles in length. Obtaining valid input signals during a noise burst of this type will be either difficult (since only an occasional sample will be unaffected) or impossible (since all samples will be corrupted during the noise burst). The signal conditioning which has been described thus far is designed to accommodate and tolerate this noise. This conditioning includes looking only at the "fat" part of the line alternation so that, in order to have any effect, the noise must be significant; taking several time-separated samples per line alternation to avoid synchronous noise; ignoring any samples where the AC line voltage itself is signalling off; and comparing the status of the sample bits from different line cycles.

Figure 8:
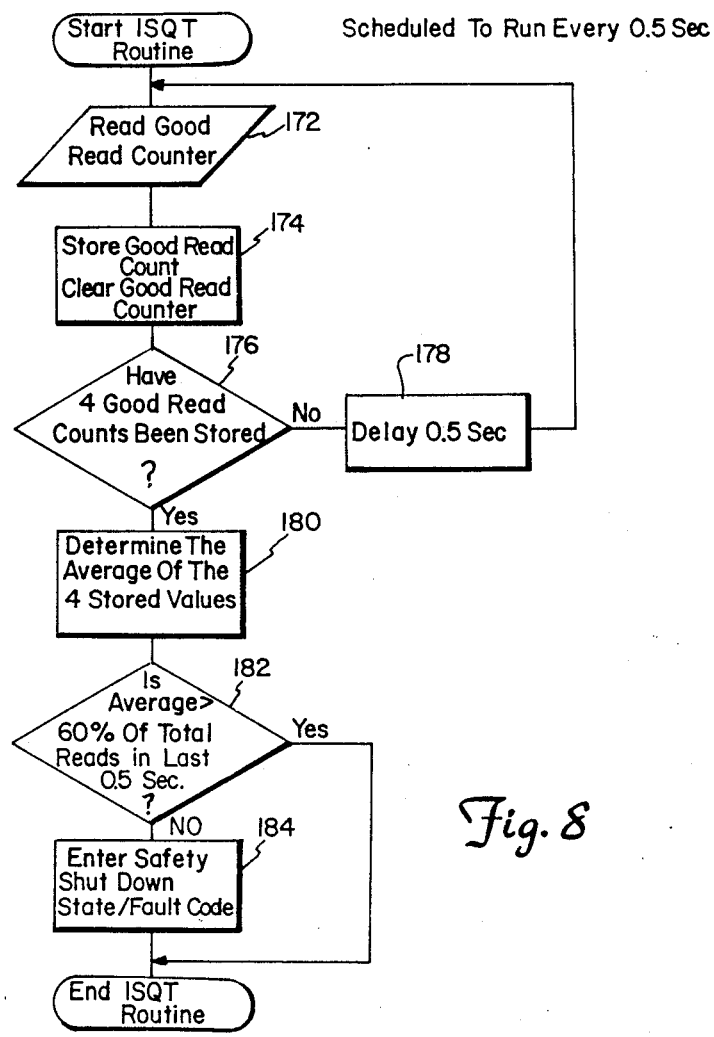
FIG. 8 is a flow chart of the Input Signal Quality Test (ISQT) routine.

However, there is still a need for a technique which will tell controller 22 when the noise on the AC input signals is so excessive as to be untrustworthy and warrant a safety shutdown. A safety shutdown is a condition of the boiler controller wherein, because of a reason related to safety, all fuel valves, ignitors, and similar safety-critical devices are commanded to a safe state (usually off). The boiler controller will typically cause an alarm to sound when it is in the safety shutdown condition and it will remain in this condition until it is manually reset. A flow diagram for this technique is shown in FIG. 8.

Each 0.5 seconds the value of the good read counter which is incremented during the OSCT routine, is read, as shown in block 172, and stored, as shown in block 174, and then the good read counter is cleared. The count from the good read counter is stored in an array which keeps the four most recent values. Each time a new value is read from the good read counter, it is stored and the oldest value is erased. This is indicated in blocks 176 and 178.

Next, as indicated in block 180, the four values which have been stored are averaged. This average value is then compared to the total possible read counts in the last 0.5 seconds (at 60 Hz this would be 30 possible read counts). If the average read count is greater than a certain threshold, in this preferred embodiment 60% of the total possible read counts, then controller 22 continues processing signals and running control system 10. This is indicated in block 182. However, if the average of the four stored values is less than 60% of the total possible read counts during the last 0.5 seconds, then controller 22 determines that the noise is excessive and, as indicated in block 184, a safety shutdown state is entered and an appropriate fault code is generated.

Negative Alternation Interrupt (NAI)

As discussed earlier, since all opto-isolators 18 should be turned off during the negative alternation of the AC line voltage, they can be tested during that period. In control system 10, primarily all of the safety critical AC input signals are designed such that, when no fault condition is present, they signal "on" when read by controller 22 during the positive alternation of the AC line voltage signal. The safety critical AC input signals would signal "off" during that time if a fault condition actually existed. Therefore, the NAI routine verifies that all the safety critical AC input signals are both electrically and logically capable of signalling a fault so that if they do signal a "on" signal which indicates that no fault is present, it is a real signal and not a circuit fault.

Figure 9:
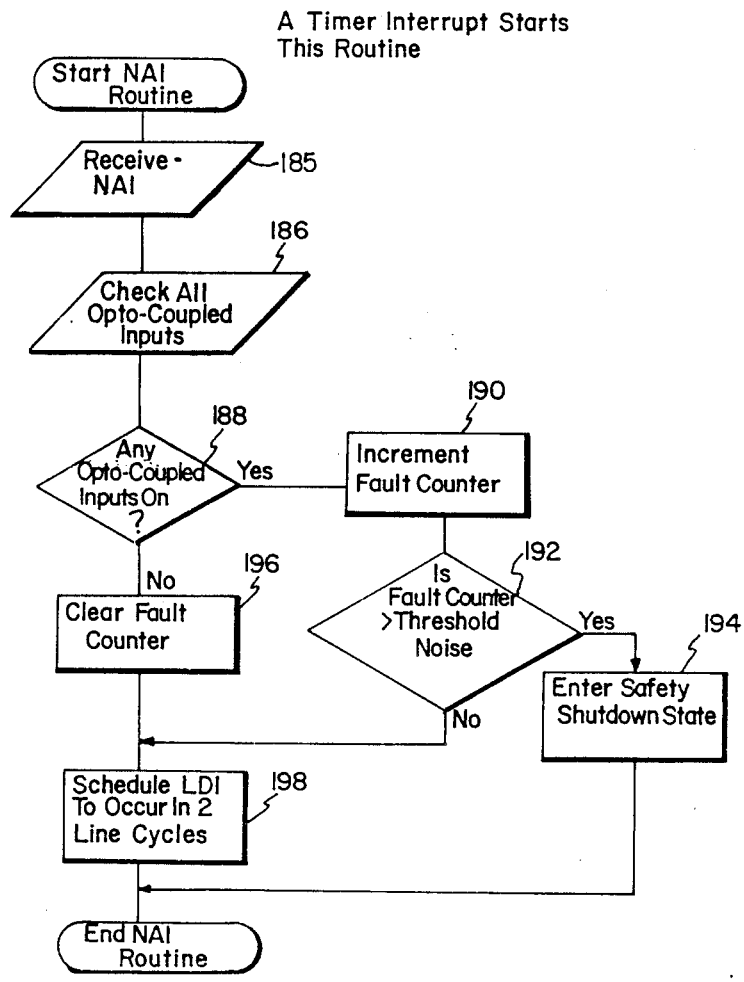
FIG. 9 is a flow chart of the Negative Alternation Interrupt (NAI) routine.

The NAI routine is triggered during the negative alternation of the AC line voltage. Since the AC input signals are phase-synchronous with the AC line voltage, the opto-isolators associated with the AC input signals should be signalling "off". Therefore, controller 22 checks all opto-coupled inputs, as indicated in blocks and 185 and 186 of FIG. 9. If any of the opto-coupled inputs are signalling "on", a fault counter is incremented. The fault counter is then compared with a noise threshold count. If the count in the fault counter is greater than the noise threshold count (in this preferred embodiment the noise threshold count is 10), a safety shutdown state is entered immediately. This is indicated in blocks 188, 190, 192 and 194 of FIG. 9. If none of the opto-coupled inputs are signalling "on", the fault counter is cleared, as indicated in block 196. If either the fault counter is cleared or the fault counter is less than the noise threshold count, an LDI routine is scheduled to occur approximately two line cycles into the future by a value loaded into one of the timers 53. This routine will be discussed in the next section.

Line Dropout Interrupt (LDI) Routine

As discussed in connection with special handling of fuel valve feedback and line dropout, a temporary line dropout may cause the fuel main valves to close temporarily. This could cause an undesirable "puff-back", which is a small explosion.

During normal operation, the LDI routine will never occur. Although it is scheduled to occur two line cycles after each NAI routine, the LDI routine is cancelled during the subsequent ACI routine, as indicated in block 98 of FIG. 5. Therefore, for the LDI routine to occur, no ACI routines must have occurred during the previous two line cycles. This will probably be the result of a power line failure where the system is running on stored energy in its power supply capacitors.

Figure 10:
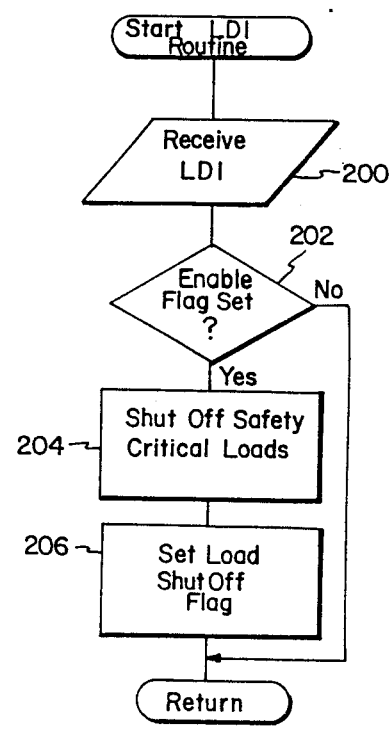
FIG. 10 is a flow chart of the Line Drop-out Interrupt (LDI) routine.

FIG. 10 is a flow diagram of the LDI routine. Block 200 shows that controller 22 receives the line dropout interrupt which was scheduled in block 198 of the NAI routine. An enable flag must be set in order for the LDI routine to shut off the safety critical loads. Therefore, block 202 indicates that controller 22 will determine whether the enable flag is properly set. If the enable flag is not set, controller 22 jumps out of the LDI routine and continues processing. However, if the enable flag is set, controller 22 shuts off the safety critical loads and sets a load shut-off flag. This is indicated in blocks 204 and 206.

An interrupt which is somewhat similar to the LDI is a power fail interrupt which is generated by a voltage detector that is monitoring the AC line voltage. When the AC line voltage drops below a certain voltage, an interrupt is generated to controller 22. The power fail interrupt will be generated when power has totally failed, whereas the LDI will be generated during a temporary power failure. The power fail interrupt causes controller 22 to execute a routine during which the safety critical loads are immediately shut off. The power fail interrupt is also generated each time control system 10 is powered up or reset to ensure that the fuel main valves are turned off.

Timing Accuracy Test

There are several long term timing inaccuracies which must be detected by burner control system 10. Examples of these inaccuracies are running control system 10 on a 50 Hz line when it is designed for a 60 Hz line, crystal oscillation in controller 22 at a harmonic of its intended frequency, and faulty timer or prescaler operation in controller 22.

Timing accuracy is a safety-critical function in control system 10 and, when gross timing inaccuracies are present, controller 22 must cause control system 10 to enter a safety shutdown state. However, certain line frequency irregularities are common and control system 10 must be tolerant of these irregularities. The accuracy of timing measurement which is needed to provide safety can be $\pm 10\%$. In other words, stop watch accuracy to the one-hundredth of a second is not necessary.

Two counters are used to perform the timing accuracy test. The first is the timing cross check counter which was described in conjunction with the ACI routine. The timing cross check counter is incremented during each positive alternation of the AC line voltage. The second counter which is used to perform the timing accuracy test is a "heartbeat" counter which is driven by a real-time timer that is, in turn, controlled by crystal oscillator 9.

Figure 11:
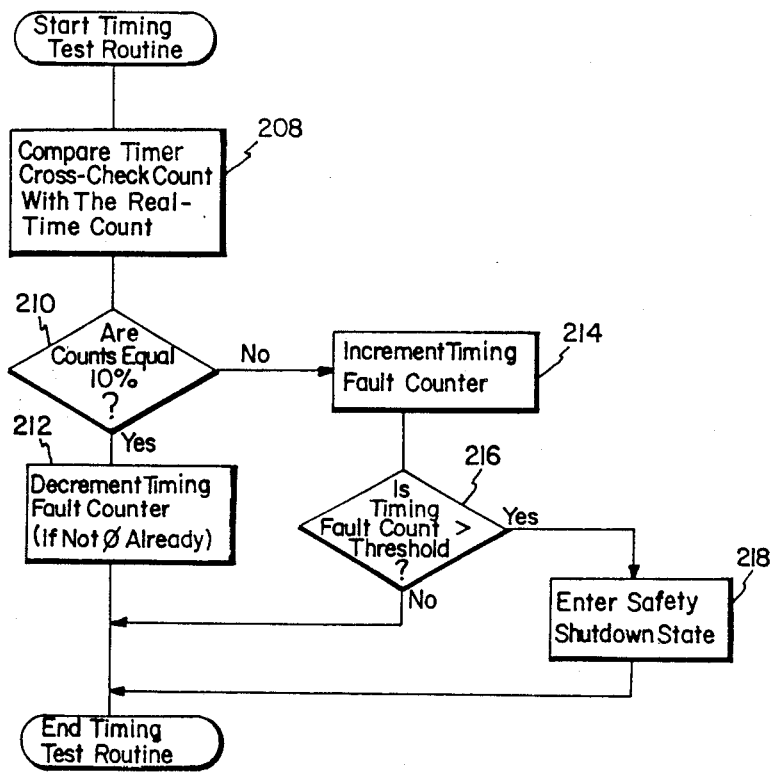
FIG. 11 is a flow chart of the Timing Test routine.

A flow diagram of the timing test routine is shown in FIG. 11. Block 208 indicates that controller 22 compares the timing cross check count with the real-time count. If the two counts are equal $+10\%$, a timing fault counter is decremented, if it is not already equal to zero, and the timing test routine is completed. This is indicated in blocks 210 and 212.

However, if the counts are not equal $+10\%$, the timing fault counter is incremented. If the timing fault counter is less than a predetermined threshold (in this preferred embodiment 10), then the timing test routine is completed. If the timing fault count is greater than the predetermined threshold, controller 22 causes control system 10 to enter a safety shutdown state and the appropriate fault code is generated. This is shown in blocks 214, 216 and 218 of FIG. 11.

Conclusion

The control system of the present invention increases reliability of AC input signals used to operate a burner or boiler. The AC input signals are optically isolated from the logic signals used by the controller in control system 10 so that transients are suppressed and the logic components in control system 10 are protected from voltage spikes.

The AC input signals are phase-synchronous with the AC line voltage and are present only during the positive alternation of the AC line voltage. This enables opto-isolators 18 to be tested during the negative alternation of the AC line voltage to ensure safety and reliability in the opto-isolator circuits.

Additionally, the AC input signals are only read during the "fat" part of the AC line voltage signal. Therefore, if any noise is present on the input signals, it must be significant in order to interfere with the reading process.

Also, the AC input signals are each sampled a plurality of times and each sample is taken in a time separated fashion. This also helps to ensure signal quality. The period of time during which the AC input signals are read is pseudo-randomly shifted in time throughout the "fat" part of the AC line voltage cycle. This helps to ensure that synchronous noise will not destroy the integrity of the input logic signals.

The input logic signals are read a plurality of times and are compared with their values during previous cycles. That combined with the use of a glitch bit and a glitch-mask bit also help to make control system 10 insensitive to noise, yet responsive to actual signal changes.

The quality of the AC input signals is assured by setting counters each time the input samples have been affected by noise. These counters are compared to a predetermined threshold to ensure that signal quality is adequate.

Additionally, race conditions are substantially prevented. Most of the techniques described above help to prevent race conditions. Additionally, when the possibility of a race condition is detected, further signal processing is deferred for two line cycles to ensure that the race will finish before any decisions are based on the processed data.

Although the present invention has been described with reference to preferred embodiments, workers skilled in the art will recognize that changes may be made in form and detail without departing from the spirit and scope of the invention.

What is claimed is:

1. A method for monitoring a plurality of AC input signals to a control system, comprising the steps of:
   generating an AC interrupt signal, based on an AC system signal which is substantially phase-synchronous with the AC input signals, for an interrupt time period corresponding to a time period when the AC system signal exceeds a predetermined threshold voltage;
   checking the AC interrupt signal to verify that the AC system signal exceeds the predetermined threshold voltage;
   setting a timer for a pseudo-random time value upon verification of the AC interrupt signal; and
   sampling the AC input signals when the timer has reached the pseudo-random time value to determine the presence or absence of the AC input signals.

2. The method of claim 1 wherein the pseudo-random time value is within the interrupt time 3. The method of claim 2 wherein the step of sampling the AC input signals further comprises the steps of:
   converting the AC input signals to logic signals having a first state when the AC input signals are above a threshold voltage and a second state when the AC input signals are below the threshold voltage; and
   reading the logic signals.

4. A method for detecting the presence or absence of a plurality of AC input signals to a control system, comprising the steps of:
   generating an AC interrupt signal, based on an AC system signal substantially phase-synchronous with the AC input signals, indicating the presence of a periodic half cycle of the AC system signal;
   setting a timer for a pseudo-random time value in response to the AC interrupt signal; and
   sampling the plurality of AC input signals when the timer has reached the pseudo-random time value to determine the presence or absence of periodic half cycles of the AC input signals.

5. The method of claim 4 wherein the periodic half cycle of the AC system signal has a half cycle time period and the pseudo-random time value is within the half cycle time period.

6. The method of claim 5 wherein the step of sampling the AC input signals further comprises the steps of:
   converting the AC input signals to logic signals representing the presence or absence of the periodic half cycles of the AC input signals; and
   reading the logic signals.

7. The method of claim 6 wherein the step of generating the AC interrupt signal is delayed until the logic signals are valid.

8. The method of claim 7, and further comprising the step of:
   checking the AC interrupt signal to verify the presence of the periodic half cycle of the AC system signal before setting the timer.

9. For use in a burner control system, a detection apparatus for detecting the presence or absence of a plurality of AC input signals, the apparatus comprising:
   AC system signal detection means for producing an AC interrupt signal for a half cycle time interval corresponding to a period when an AC system signal exceeds a predetermined threshold where the AC system signal is substantially phase-synchronous with the AC input signals;
   timer setting means, coupled to the AC system signal detection means, for setting a timer for a pseudo-random time value in response to the AC interrupt signal; and
   input sampling means for sampling the AC input signals when the timer has reached the pseudo-random time value to determine the presence or absence of the AC input signals.

10. The detection apparatus of claim 9 wherein the input sampling means further comprises:
    AC converting means for converting the AC input signals to logic signals having a first state when the AC input signals are above a threshold voltage and a second state when the AC input signals are below the threshold voltage; and
    reading means for reading the logic signals.

11. The detection apparatus of claim 10 and further comprising:
    delay means for delaying the AC interrupt signal from the AC system signal detection means allowing the logic signals to become valid.

12. The detection apparatus of claim 11 wherein the pseudo-random time value is within the half cycle time interval.

13. The detection apparatus of claim 12 and further comprising:

checking means for checking the AC interrupt signal to verify that the AC system signal exceeds the predetermined threshold.

14. The detection apparatus of claim 13 wherein the AC system signal detection means further comprises:
rectifier means for rectifying the AC system signal and producing a rectified signal when the AC system signal reaches the predetermined threshold;
filter means, coupled to the rectifier means, for filtering the rectified signal;
opto-isolator means, coupled to the filter means, for producing the AC interrupt signal representative of the rectified signal; and
output means, coupled to the optoisolator means, for filtering the AC interrupt signal.

15. The detection apparatus of claim 13 wherein the AC converting means further comprises:
rectifier means for rectifying the AC input signals and for producing rectified signals when the AC input signals reach the predetermined threshold;
filter means, coupled to the rectifier means, for filtering the rectified signals;
opto-isolator means, coupled to the filter means, for producing the logic signals representative of the rectified signals; and
output filter means, coupled to the opto-isolator means for filtering the logic signals.

* * * * *

UNITED STATES PATENT AND TRADEMARK OFFICE
CERTIFICATE OF CORRECTION

PATENT NO. : 4,965,755

DATED : October 23, 1990

INVENTOR(S) : Paul B. Patton et al.

It is certified that error appears in the above-identified patent and that said Letters Patent is hereby corrected as shown below:

Col. 15, line 58, after "time", insert the word "period."

Signed and Sealed this

Eighteenth Day of February, 1992

Attest:

HARRY F. MANBECK, JR.

Attesting Officer

Commissioner of Patents and Trademarks